United States Patent
Goldman

(10) Patent No.: US 7,093,054 B1
(45) Date of Patent: Aug. 15, 2006

(54) METHOD OF TRANSFERRING SIGNALS BETWEEN A TTL MICROCONTROLLER AND A RS232 DEVICE

(75) Inventor: Steven J. Goldman, Pipersville, PA (US)

(73) Assignee: National Semiconductor Corporation, Santa Clara, CA (US)

( * ) Notice: Subject to any disclaimer, the term of this patent is extended or adjusted under 35 U.S.C. 154(b) by 178 days.

(21) Appl. No.: 10/788,819

(22) Filed: Feb. 27, 2004

Related U.S. Application Data

(62) Division of application No. 09/483,628, filed on Jan. 14, 2000, now Pat. No. 6,738,855.

(51) Int. Cl.
G06F 13/14 (2006.01)

(52) U.S. Cl. .......................... 710/305; 710/71; 710/307
(58) Field of Classification Search ...................... None
See application file for complete search history.

(56) References Cited

U.S. PATENT DOCUMENTS

| | | | |
|---|---|---|---|
| 3,961,326 A | 6/1976 | Craven ........................ 340/347 |
| 4,130,883 A * | 12/1978 | Hazelton ...................... 710/71 |
| 4,356,452 A | 10/1982 | Iwamatsu .................... 330/265 |
| 4,489,283 A | 12/1984 | Ishizaki ....................... 330/268 |
| 4,491,804 A | 1/1985 | Main et al. .................. 330/265 |
| 4,497,041 A | 1/1985 | Braun .......................... 364/900 |
| 4,509,113 A | 4/1985 | Heath .......................... 364/200 |
| 4,589,106 A | 5/1986 | Prather et al. ................. 370/58 |
| 4,695,955 A | 9/1987 | Faisandier ................... 364/413 |
| 4,725,836 A | 2/1988 | Guidos .................. 340/825.59 |
| 4,764,939 A | 8/1988 | Rogers ......................... 375/37 |
| 4,833,423 A | 5/1989 | Molloy ........................ 330/265 |
| 4,866,667 A * | 9/1989 | Shimada ...................... 710/316 |
| 4,898,547 A * | 2/1990 | Bottoms et al. ............. 439/652 |
| 5,432,698 A | 7/1995 | Fujita ..................... 364/413.02 |
| 5,506,991 A | 4/1996 | Curry et al. ................. 395/800 |
| 5,555,545 A * | 9/1996 | Yang ........................... 375/220 |
| 5,596,637 A | 1/1997 | Pasetti et al. ............... 379/399 |
| 5,701,103 A | 12/1997 | Fujii ........................... 330/290 |
| 5,721,933 A * | 2/1998 | Walsh et al. ................ 713/300 |
| 5,727,221 A * | 3/1998 | Walsh et al. ................ 713/310 |
| 5,771,373 A * | 6/1998 | Kau et al. ................... 713/500 |
| 5,812,879 A | 9/1998 | Moro ......................... 395/882 |

(Continued)

OTHER PUBLICATIONS

Ossman, M., "Single μC Pin Makes Half-Duplex RS-232C", Electronic Design News, pp. 118, Aug. 5, 1999.

(Continued)

*Primary Examiner*—Mark H. Rinehart
*Assistant Examiner*—Justin I. King
(74) *Attorney, Agent, or Firm*—Stallman & Pollock LLP

(57) ABSTRACT

A switching transistor is placed between a serial port of a RS232 device and a parallel port of a TTL microcontroller. Selective activation of the switching transistor permits a high voltage signal to be transmitted from the power supply rail of the TTL microcontroller to the RXD pin of the RS232 device, where the signal is interpreted as a logical low. This step takes advantage of the fact that the RS232 standard interprets any voltage received at the RXD pin greater than a receiver threshold value to be a logical low. Selective deactivation of the switching transistor isolates the RS232 port from the non-RS232 device, permitting negative voltage signal output by the TXD pin of the idling RS232 port to be conveyed back to the RS232 port at the RXD pin. This negative voltage signal is interpreted by the RS232 port as a logical high signal.

5 Claims, 4 Drawing Sheets

U.S. PATENT DOCUMENTS

| | | | | |
|---|---|---|---|---|
| 5,844,829 | A | 12/1998 | Freidin et al. | 364/716.03 |
| 5,901,221 | A | 5/1999 | Eriksson et al. | 379/399 |
| 5,951,660 | A | 9/1999 | Van Wonterghem | 710/103 |
| 5,956,523 | A | 9/1999 | Chen | 395/882 |
| 6,502,143 | B1 | 12/2002 | Bass et al. | 710/1 |
| 2006/0006907 | A1* | 1/2006 | Hsieh | 326/70 |

OTHER PUBLICATIONS

"COP8SA Family 8-Bit CMOS ROM Based and One-Time Programmable (OTP) Microcontroller with 1K to 4K Memory, Power on Reset, and Very Small Packaging", National Semiconductor Corporation, Preliminary Jul. 1999 (DS012838).

"PC16550D Universal Asynchronous Receiver/Transmitter with FIFOs", National Semiconductor Corporation, TL/C/8652, Jun. 1995.

"DSV14196 +3.3V Supply EIA/TIA-232 5 Driver ×3 Receiver", National Semiconductor Corporation, DSI00853, Apr. 1999.

Campbell G.W., "Low Power RS-232C Driver and Receiver in CMOS", National Semiconductor Corporation, AN008681, Application Note 438, Jul. 1986.

Goldie J., "Summary of Well Known Interface Standards", National Semiconductor Corporation, AN005855, Application Note 216, Jul. 1998.

Horowitz, P. et al., excerpts from "The Art of Electronics", Second Edition, Digital Signals and Long Wires, pp. 603; Digital Meets Analog, pp. 604; Low-Power Design, pp. 984; Self-Explanatory Circuits pp. 985, 1980, 1989.

John F. Wakerly, Digital Design Principles & Practices, 1990, Prentice Hall, 3rd edition, pp. 157-158.

ARC Electronic, RS232 Interface, 1999, http://www.arcelect.com/rs232.htm.

ELM Electronics, ELM 624-Control L to RS232 Interpreter, 1999, http://www.elmelectronics.com.

ELM Electronics, ELM621-Serial Three Bit Port, 1999, http://www.elmelectronics.com.

TechEncyclopedia, PMOS definition, http://www.techweb.com/encyclopedia/defineterm?term=pmos.

* cited by examiner

METHOD OF TRANSFERRING SIGNALS BETWEEN A TTL MICROCONTROLLER AND A RS232 DEVICE

This application is a division of allowed U.S. application Ser. No. 09/483,628, filed Jan. 14, 2000 now U.S. Pat. No. 6,738,855.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates to a communications circuit, and in particular, to an interface circuit permitting communication between circuits utilizing dissimilar logic families without requiring level translation.

2. Description of the Related Art

The Electronic Industry Association (EIA) and the Telecommunications Industry Association (TIA) are industry trade associations that have developed standards to simplify data communications. The TIA/EIA-232 (RS232) is one of the oldest and most widely known communication standards. It describes an unbalanced, unidirectional, point-to point interface. The RS232 communication standard has periodically been updated, with the latest revision being RS232-G.

The RS232 standard recognizes differential voltage signals ranging from −12V to +12V. At the time of adoption of the RS232 standard, the ±12V range provided a voltage spectrum broad enough to permit a variety of analog functions to be performed while the resulting signal remained comfortably above background noise. Of course, RS232 circuits were also utilized in digital applications, and an RS232 truth table is given below in TABLE A:

TABLE A

RS232 Truth Table

| VOLTAGE | LOGIC STATE |
| --- | --- |
| +3 V to +12 V | low (=0) |
| −3 V to −12 V | high (=1) |

While the RS232 standard was once prevalent, over time the widespread use of digital technology dictated the implementation of logic families having voltage ranges different than that of the RS232. For example, reduced voltage ranges became available due to improvement in hardware having reduced background noise levels. Lower voltage ranges were also useful in preserving the thin and fragile gate dielectric structures of MOS devices increasingly employed in digital applications.

Accordingly, more recently implemented logic families utilize a narrower, single-ended voltage range. Voltage signals in these logic families are compatible with the requirements of MOS transistor operation, and reflect reduced noise levels typically encountered in existing digital technology. One such logic family is the transistor-transistor-logic family (TTL). A truth table for TTL is shown below in TABLE B:

TABLE B

TTL Truth Table

| VOLTAGE | LOGIC STATE |
| --- | --- |
| 0 V to +0.8 V | low (=0) |
| +2.4 V to +5.0 V | high (=1) |

In recent years, several factors have prompted adoption of logic families featuring even narrower voltage ranges than the TTL logic family. One factor is an increased emphasis on portable applications requiring reduced power consumption in order to conserve battery life. Another factor is the ever-shrinking size of MOS devices and the corresponding need to preserve the integrity of thin gate dielectric structures in the presence of applied voltages.

While technology is evolving away from the RS232 communications standard, this standard is still employed in a wide variety of applications. Therefore, there is a need in the art for an interface circuit permitting communication to occur between devices utilizing the RS232 standard and devices utilizing the various other logic families.

FIG. 1 shows a schematic diagram of a conventional interface circuit positioned between a host device featuring an RS232 port, and a peripheral device controlled by a microcontroller utilizing the TTL logic family. Communication circuit 100 includes host device 101 featuring RS232 port 102 having transmit data (TXD) pin 104 and receive data (RXD) pin 106. TXD pin 104 and RXD pin 106 emit and receive, respectively, signals in which between +3V and +12V are interpreted as a logical low state (=0) and between −3V and −12V are interpreted as a logical high state (=1).

TTL microcontroller 107 of peripheral device 108 features eight pin parallel port 109. Pins 110 of port 109 emit and receive respectively, voltage signals where between 0V and +0.8V represents a logical low state (=0) and between +2.4V and +5V represents a logical high state (=1).

In order to permit communication to occur between host device 101 and peripheral device 107, interface circuit 100 further includes level shift/buffer 116 and universal asynchronous receiver/transmitter (UART) 118.

The role of level shift/buffer 116 is to perform level translation on the voltage signals being exchanged between host device 101 and peripheral device 107, such that voltage signals correlating to appropriate logic values are communicated between the devices. Thus, where a logical low (+0V) TTL signal is being transmitted from pin 112 of TTL peripheral device 107, level shift/buffer 116 converts this signal to the +12V logical low value understood by RS232 device 101. Conversely, where a logical high value of −12V is being transmitted from RS232 port 102, level shift/buffer 116 converts this signal to the +5V logical high value understood by TTL peripheral device 107. A level shift/buffer commonly employed for this purpose is National Semiconductor Corporation part No. DS14C535, which requires connection to power supplies of both the +5V and ±12V variety.

The role played by UART 118 in permitting communication between the RS232 and non-RS232 devices two-fold.

UART 118 performs serial-to-parallel or parallel-to-serial conversion of signals exchanged between host RS232 device 101 and peripheral TTL device 107, such that each device receives a signal in the appropriate form. Thus UART 118 assembles a serial stream of one-bit signals transmitted from RS232 port 102, into discrete eight-bit words recognized at parallel port 109 by peripheral device 107. Conversely, where an eight-bit data word is being transmitted in parallel form from pins 110 of peripheral device 107, UART 118 converts this parallel word into a serial stream of one-bit signals recognized at RS232 port 102 of host device 101. A UART commonly employed for use in interface applications is National Semiconductor Corporation part No. PC16550D.

The second function performed by UART 118 is to coordinate timing of transmission of the serial stream of electrical signals between the devices. Upon receiving a START bit from a transmitting device, UART 118 synchronizes receipt of the serial data stream at regular, predetermined intervals, enabling the serial data to be properly recognized.

While the conventional communication interface circuit shown in FIG. 1 is suitable for some applications, it suffers from a number of disadvantages. One disadvantage is a high part count. Specifically, the conventional interface circuit requires separate level shift/buffer and UART components described above. These components each contribute expense and complexity to the interface circuit. Another disadvantage of the conventional circuit is that the level/shift buffer component must be connected with power supplies of both devices in order to perform level translation. A further disadvantage is that the UART component is typically bulky and consumes precious space on the circuit board.

Therefore, there is a need in the art for a compact, simple, and inexpensive communication interface circuit between devices utilizing different logic families which does not require separate components to perform level translation and parallel/serial conversion.

SUMMARY OF THE INVENTION

The present invention is a communications interface circuit enabling communication between devices utilizing dissimilar logic families, without requiring level translation. Proper conversion of the voltage level of exchanged signals is accomplished by interposing a switching transistor between the two devices.

Taking advantage of a receiver threshold value of a first device, selective activation of the switching transistor permits a voltage signal in excess of the receiver threshold voltage to be transmitted from a second device to the first device. This voltage signal is interpreted by the first device as the correct logic level.

In another aspect of the present invention, the first device transmits a default voltage from the transmit pin while receiving a voltage on the receiver pin. Taking advantage of this property, selective deactivation of the switching transistor isolates the first device from the second device, permitting the default voltage signal output from the transmit data pin of the first device to be returned back to the receive data pin the same (first) device.

An apparatus including a communication interface circuit in accordance with a first embodiment of the present invention comprises a first device including a first receive data terminal, a first transmit data terminal, a first power supply terminal configured to convey a first power supply voltage, and a second power supply terminal configured to convey a second power supply voltage. A second device includes a third power supply terminal configured to bear a third power supply voltage different from the first power supply voltage, a fourth power supply terminal configured to bear a fourth power supply voltage different from the second power supply voltage, a second receive data terminal configured to convey a received data signal, and a second transmit data terminal configured to convey a default voltage while the second receive data terminal receives a data signal. The second device interprets the received data signal traversing a receiver threshold value as a first logic state and interpreting the received data signal not traversing the receiver threshold value as a second logic state opposite the first logic state, the first power supply voltage traversing the receiver threshold value. A switch includes a first node, a second node, and a control node. The first node is in electrical communication with the first transmit data terminal, the second transmit data terminal, and the second receive data terminal. The second node is in electrical communication with the first power supply terminal, and the control node in electrical communication with the first receive data terminal. The switch is configured to a first state to convey the first power supply voltage to the second receive data terminal, and the switch is configured to a second state to convey the default voltage signal from the second transmit data terminal to the second receive data terminal, and to convey a voltage signal from the second transmit data terminal to the first receive data terminal.

A method in accordance with one embodiment of the present invention for communicating between a first device utilizing a first logic family and a second device utilizing a second logic family different from the first logic family comprises the steps of forming an electrical connection between a first node of a switch and a transmit data terminal of the first device. An electrical connection is formed between the first switch node and a transmit data terminal of the second device. An electrical connection is formed between the first switch node and a receive data terminal of the second device, and an electrical connection is formed between a second node of the switch and a power supply of the first device. An electrical connection is formed between a control node of the switch and a receive data terminal of the first device. A first power supply voltage is transmitted from the receive data terminal of the first device to the switch control node, such that the switch is placed into a first state and a second power supply voltage is conveyed from the transmit data terminal of the second device to the transmit data terminal of the first device. The first power supply voltage is transmitted from the receive data terminal of the first device to the switch control node, such that the switch is placed into the first state and a third power supply voltage is conveyed from the transmit data terminal of the second device to the receive data terminal of the second device. A fourth power supply voltage is transmitted from the receive data pin of the first device to the switch control node, such that the switch is placed into a second state and the first power supply voltage is conveyed from the first device to the receive data pin of the second device, the second device interpreting the received first power supply voltage traversing a receiver threshold value as a first logic state.

The features and advantages of the present invention will be understood upon consideration of the following detailed description of the invention and the accompanying drawings.

DETAILED DESCRIPTION

The present invention describes an interface circuit permitting communication between devices utilizing dissimilar logic families, without requiring level translation. This is accomplished by interposing a switching transistor between the two devices.

Figure 2:
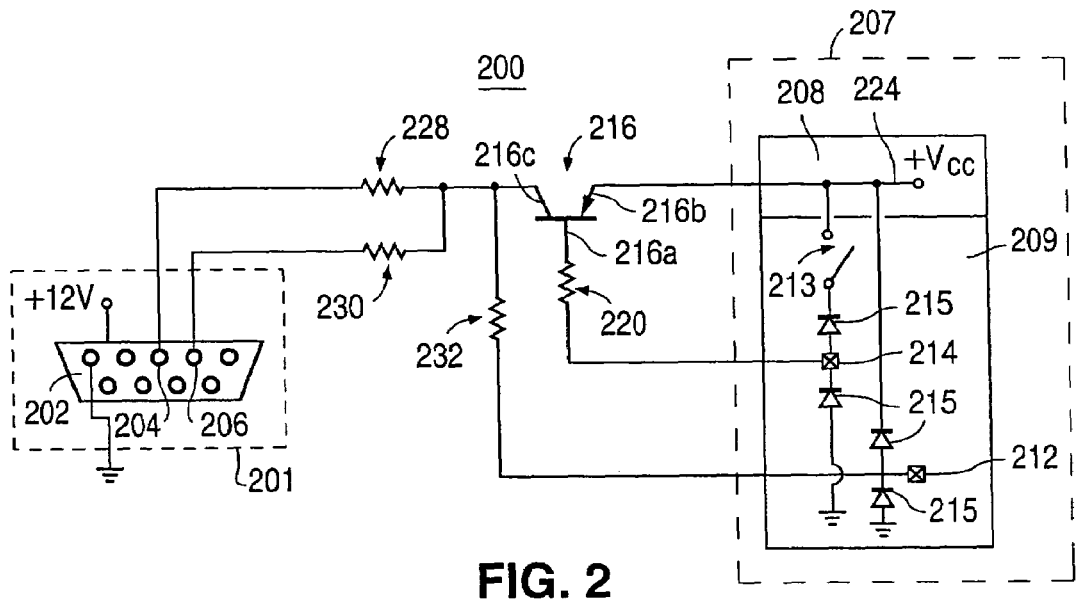
FIG. 2 shows a schematic diagram of a communications interface circuit in accordance with one embodiment of the present invention.

FIG. 2 shows a schematic diagram of a one embodiment of a communications interface circuit in accordance with the present invention. Communication circuit 200 includes host device 201 including RS232 port 202 featuring TXD pin 204 and RXD pin 206. TXD pin 204 and RXD pin 206 emit and receive, respectively, voltage signals whereby voltages between +3V and +12V are interpreted to represent a logical low state (=0), and voltages between −3V and −12V are interpreted to represent a logical high state (=1).

TTL microcontroller 208 of peripheral device 207 features parallel port 209 including eight pins, only two of which are shown in FIG. 2 as TXD pin 212 and RXD pin 214. TXD pin 212 and RXD pin 214 are configured to emit and receive respectively, voltage signals whereby voltages between 0V and +0.8V are interpreted to represent a logical low state (=0), and voltages between +2.4V and +5V are interpreted to represent a logical high state (=1). RXD pin 214 is capable of being connected with power supply rail 224 through switch 213.

Microcontroller 208 of peripheral device 207 also includes diodes 215 at RXD pin 212 and TXD pin 214. Diodes 215 limit the voltage of electrical signals permitted to enter pins 212 and 214, protecting microcontroller 208 from damage in the event of exposure to excessively high input voltages.

Communication interface circuit 200 further includes PNP switching transistor 216. Base 216a of PNP switching transistor 216 is connected to RXD pin 214 of microcontroller 208 through first (10 KΩ) resistor 220. First resistor 220 limits the amount of base current through transistor 216. Emitter 216b of PNP transistor 216 is connected to +5V power supply rail 224. Power supply rail 224 may, but need not be, the same power supply utilized by TTL microcontroller 208.

TXD pin 204 of RS232 device 202 is connected with collector 216c of PNP transistor 216 through second (1KΩ) resistor 228. RXD pin 206 of RS232 port 202 is connected with collector 216c of PNP transistor 216 through third (1KΩ) resistor 230. TXD pin 212 of microcontroller 207 is connected with collector 216c of PNP transistor 216 through fourth (47KΩ) resistor 232. Resistors 228, 230, and 232 serve primarily as current limiting devices.

Figure 3A:
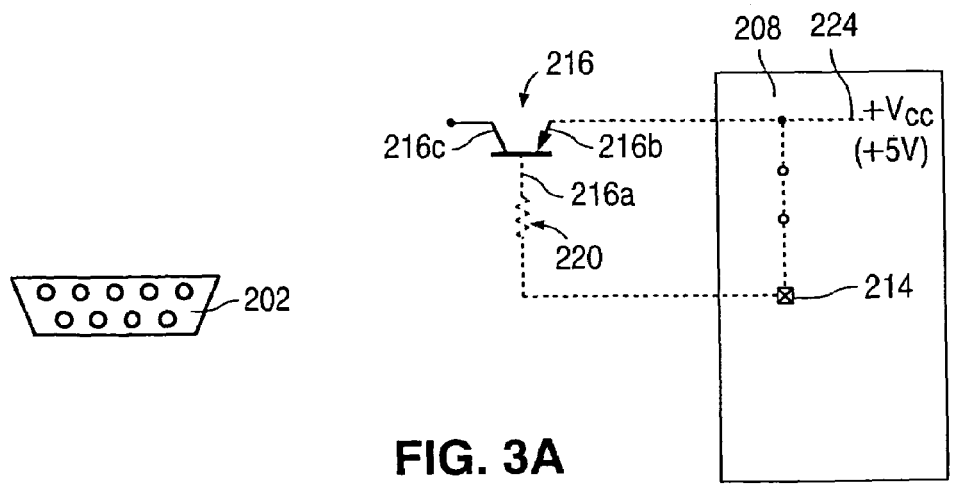
FIGS. 3A–3F show schematic diagrams illustrating operation of the circuit shown in FIG. 2.

Operation of the communication interface circuit of FIG. 2 is illustrated in FIGS. 3A–3F. FIG. 3A shows that for peripheral device 207 to receive data from RS232 device 202, switch 213 is activated. This causes RXD pin 214 of microcontroller 208 to be coupled with power supply rail 224 via diode 215 and exhibit the logical high state of +5V, and PNP switching transistor 216 to be turned off.

Figure 3B:
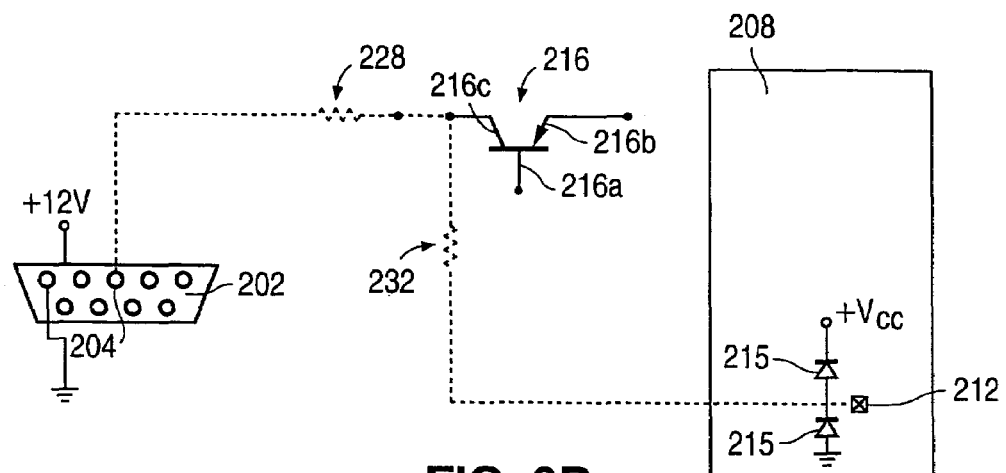

As a result, FIG. 3B shows transmission of a ±12V signal from TXD pin 204 of RS232 device 202, through second (1KΩ) resistor 228 and fourth (47KΩ) resistor 232 to TXD pin 212 of microcontroller 208. The polarity of the signal received at TXD pin 212 is automatically inverted by software controlling microcontroller 208, eliminating the need for a separate physical inverter.

Figure 4A:
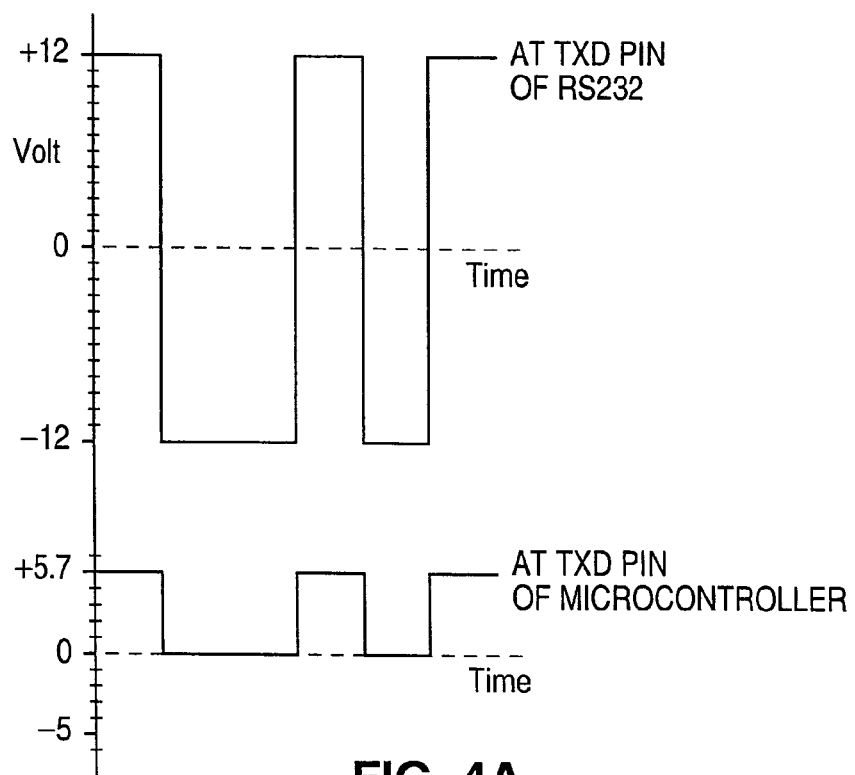
FIGS. 4A–4B show voltage timing diagrams illustrating the voltage conversion performed by the interface circuit of FIG. 2.

Assuming that the voltage and current of the transmitted signal do not exceed the range permitted by resistors 228 and 232 and diodes 215, the +12V signal is clamped at approximately +5.7V by the upper internal diode 215. Similarly, a −12V signal is clamped at approximately −0.7V by the lower internal diode 215. While both of these voltages are technically outside the official TTL signal voltage ranges, they will be recognized correctly nonetheless since they still fall within the maximum and minimum voltage limits for TTL compatible devices. FIG. 4A shows the voltage traces generated during this signal transmission stage of operation.

Figure 3C:
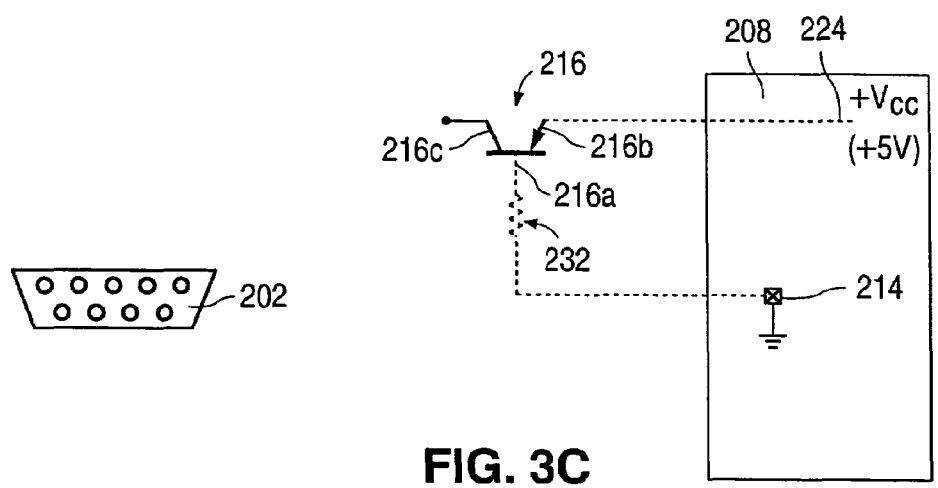
Figure 3D:
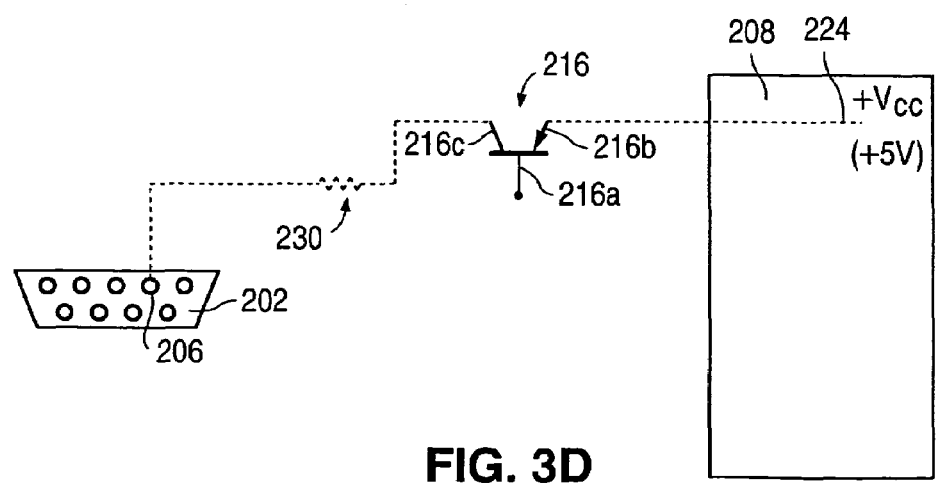

Next, FIG. 3C shows transmission of a logical low (=0) signal from microcontroller 208 to RS232 device 202. This is accomplished by grounding RXD pin 214 of microcontroller 208, thereby turning on PNP transistor 216. FIG. 3D shows that under these conditions, current flows from power supply rail 224 through switching transistor 216 and third resistor 230, to RXD pin 206 of RS232 device 202. Because the RS232 standard establishes a receiver threshold value of +3V calling for any received voltage in excess of +3V to be interpreted as a low logic value, the approximately +5V input signal received at RXD pin 206 is interpreted by RS232 device 202 as if it were a +12V (logical low) signal.

Figure 3E:
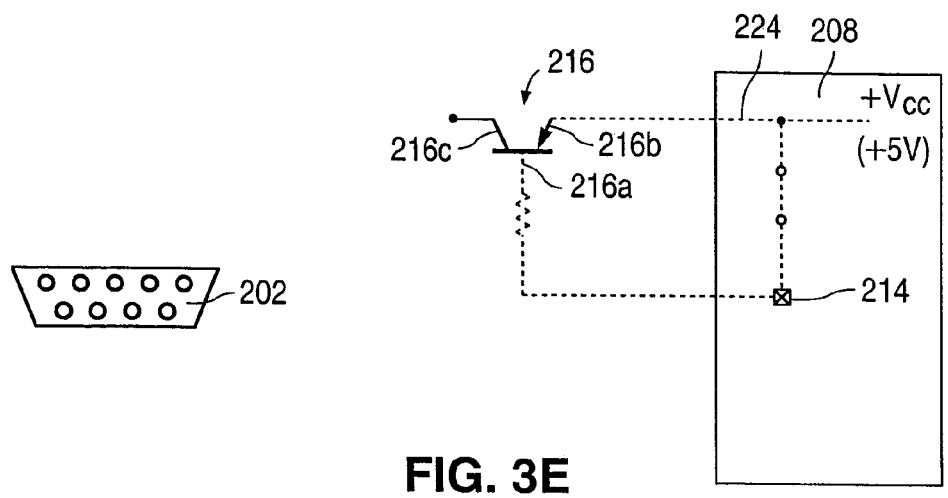
Figure 3F:
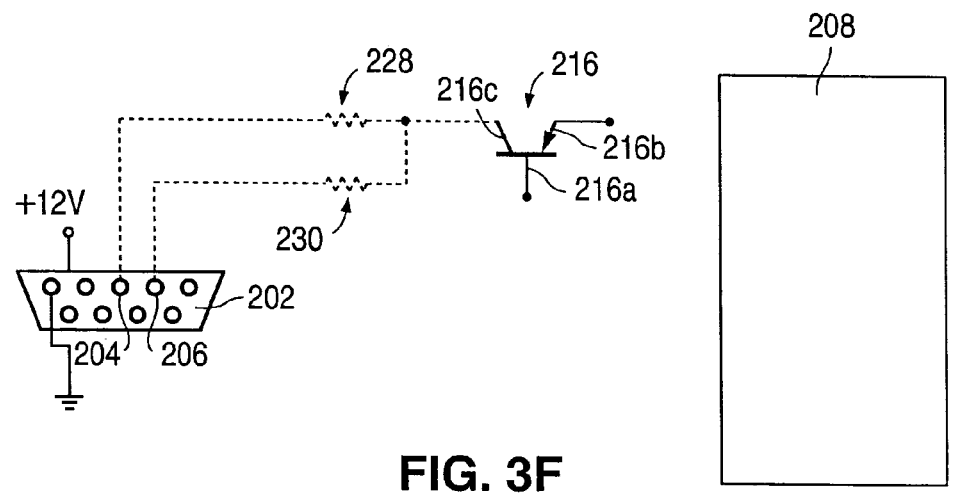

FIGS. 3E–3F shows transmission of a logical high (=1) signal from microcontroller 207 to RS232 device 202.

First, FIG. 3E shows activation of switch 213 placing RXD pin 214 of microcontroller 208 in communication with high voltage rail 224, such that PNP transistor 216 is deactivated and high voltage power supply rail 224 is isolated from RS232 port 202.

Next, FIG. 3E shows that because the RS232 standard requires TXD pin 204 to continuously emit a −12V voltage when RS232 device 202 is otherwise idle, the present invention returns this default −12V voltage back to RS232 device 202 at RXD pin 206 as though this signal were externally generated. The −12V signal received on RXD pin 206 is naturally interpreted by RS232 device 202 as a logical high (=1) value.

During the step of receiving a voltage signal as shown in FIGS. 3D and 3F, inversion of the voltage signal by the microcontroller software is not required. The logical low signal is transmitted as +5V and interpreted by the RS232 device as +12V. The logical high signal is transmitted as −12V and then returned unchanged to the RS232 device for interpretation.

Figure 4B:
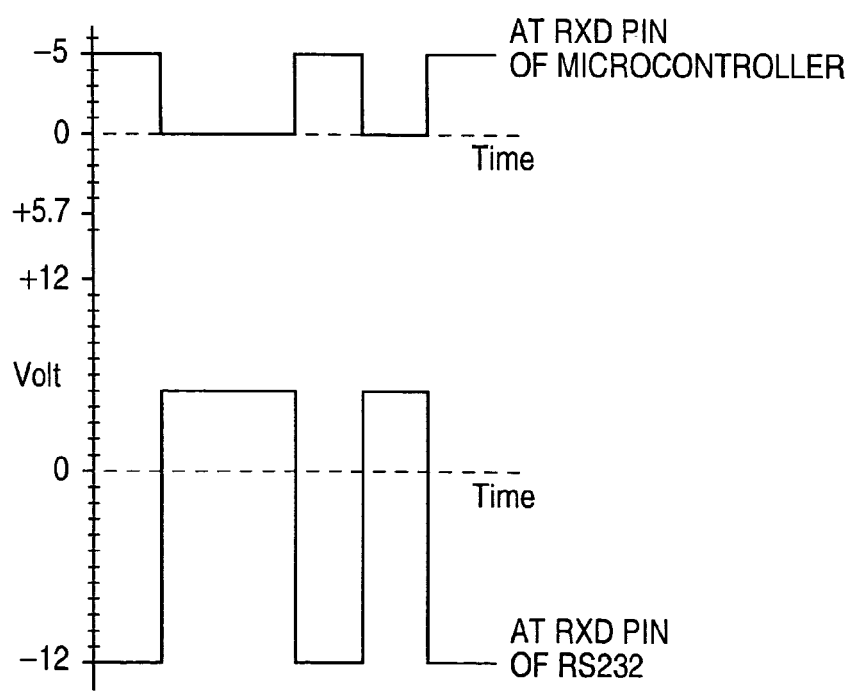

FIG. 4B shows the voltage traces generated during receipt of signals by the RS232 device. Because of the reduced receiver threshold voltage required by the RS232 device to indicate a logical low state (+3V rather than the full +12V), the +5V signal received at the RXD pin of the RS232 device is interpreted as a logical low value. The unchanged −12V signal returned to the RS232 device is simply interpreted as a logical high value.

The present invention offers a number of important advantages over conventional communication interface architectures. One important advantage is reduction in part count. The interface circuit in accordance with the present invention replaces two parts (the level shift/buffer and the UART) with a single switching transistor, a few resistors, and the microcontroller of the peripheral device.

To understand how the UART component is replaced by the present invention, recall that the primary function of the UART is to conduct serial-to-parallel or parallel-to-serial conversion and to synchronize the exchange of data between the RS232 (serial) port and the TTL (parallel) microcontroller port. Where conversion of voltage signals to conform to appropriate logic levels is performed in accordance with the present invention rather than by a separate level shift/buffer component, it is possible to program the microcontroller to perform the necessary synchronization and serial/parallel conversion.

For example, National Semiconductor Corporation part no. COP8SA is an economical 8-bit microcontroller designed for embedded applications. The COP8SA includes a pin addressable 8-bit parallel port. Where the present invention is being utilized to permit communication between an RS232 device and a COP8SA microcontroller, a simple software program accomplishes: 1) inversion of the signal received at the COP8SA RXD pin as described in connection with FIG. 3B; 2) serial-to-parallel conversion of signals received from the RS232 device; 3) parallel-to-serial conversion of signals transmitted to the RS232 device; and 4) synchronization of exchange of signals between the RS232 and non-RS232 devices. Programming the microcontroller to control synchronization is discussed in *The Art of Electronics*, Horowitz and Hill, (2nd. Ed. 1989), Cambridge University Press, pp. 984, hereby incorporated by reference.

A simple software program written for the COP8SA microcontroller is set forth in the SOURCE CODE APPENDIX attached at the end of this detailed description. The software program also controls output of signals at the pins of the parallel port of the microcontroller.

Figure 1:
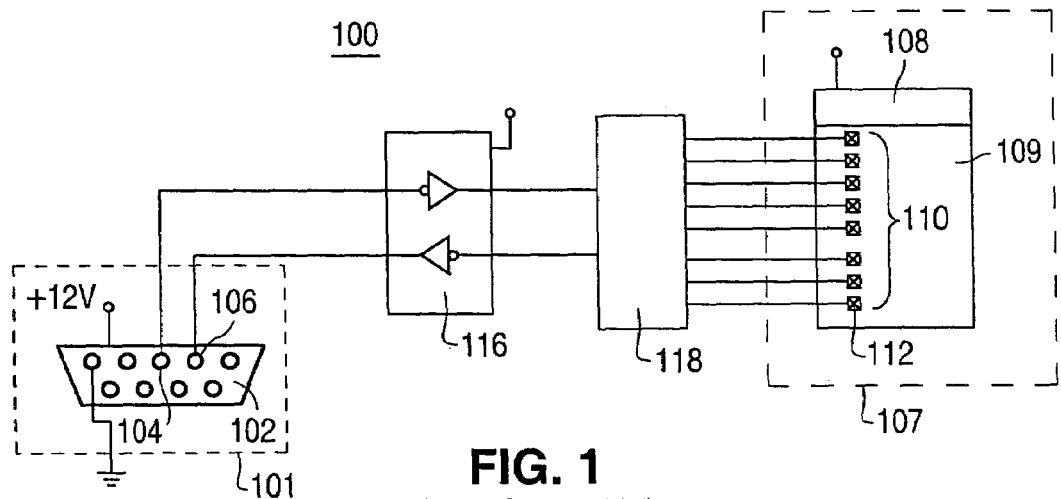
FIG. 1 shows a schematic diagram of a conventional communication interface circuit requiring level translation.

The part count reduction offered by the first embodiment of the interface circuit of in FIGS. 2–3F reduces bulk and significantly lowers the cost of the interface circuit. For example, a rough estimate of the cost of the conventional interface circuit shown in FIG. 1 is $5.80=$3.00 (National Semiconductor UART PC16550D)+$2.80 (National Semiconductor level shift/buffer DS14C535). By comparison, the cost of the transistor and resistors shown in FIG. 2 is about $1.25, a savings of almost 80%.

Significantly, the transistor and resistors utilized in the present invention in place of the level shift/buffer can also be physically incorporated within the microcontroller without affecting its operation. In this manner, the present invention could be integrated directly into the microcontroller itself, eliminating the bulk of a separate component containing the switching transistor and resistors.

Another advantage of a communication interface circuit in accordance with the first embodiment of the present invention is elimination of an external charge pump. Because the interface circuit utilizes the existing power supply of the microcontroller to accomplish voltage conversion, no separate voltage supply is required, and the complexity and cost of the device is further reduced.

Although the invention has so far been described in connection with one particular embodiment, it must be understood that the present invention should not be unduly limited to this specific example. Various modifications and alterations in the structure and process of the present invention will be apparent to those skilled in the art without departing from the scope of the present invention.

Figure 5:
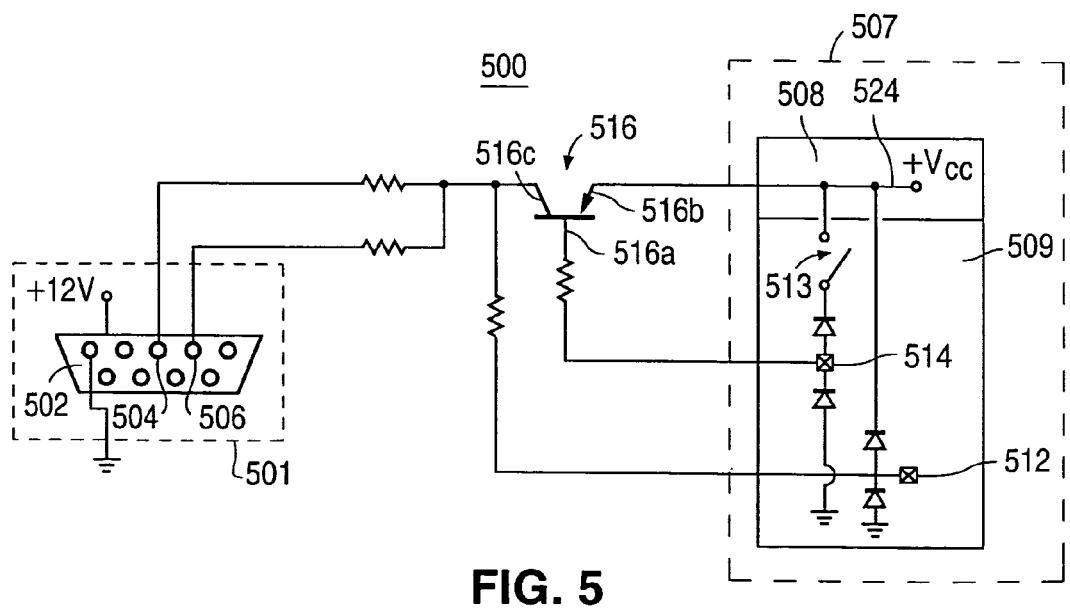
FIG. 5 shows a schematic diagram of a communications interface circuit in accordance with an alternative embodiment of the present invention.

For example, while FIGS. 2 and 3A–3F depict an interface circuit controlled by a bipolar switching transistor, this is not required by the present invention. FIG. 5 shows a schematic diagram of a first alternative embodiment of a communications interface circuit in accordance with the present invention. Communication circuit 500 includes host device 501 including RS232 port 502 featuring TXD pin 504 and RXD pin 506. TXD pin 504 and RXD pin 506 emit and receive, respectively, voltage signals whereby voltages between +3V and +12V are interpreted to represent a logical low state (=0), and voltages between −3V and −12V are interpreted to represent a logical high state (=1).

TTL microcontroller 508 of peripheral device 507 features parallel port 509 including eight pins, only two of which are shown in FIG. 2 as TXD pin 512 and RXD pin 514. TXD pin 512 and RXD pin 514 are configured to emit and receive respectively, voltage signals whereby voltages between 0V and +0.8V are interpreted to represent a logical low state (=0), and voltages between +2.4V and +5V are interpreted to represent a logical high state (=1). RXD pin 514 is capable of being connected with power supply rail 524 through switch 513.

Communication interface circuit 500 further includes PMOS switching transistor 516. Gate 516a of PMOS switching transistor 516 is connected to RXD pin 514 of microcontroller 508. Source 516b of PMOS transistor 516 is connected to +5V power supply rail 524. Power supply rail 524 may, but need not be, the same power supply utilized by TTL microcontroller 508.

TXD pin 504 of RS232 device 502 is connected with drain 516c of PMOS transistor 516. RXD pin 506 of RS232 port 202 is connected with drain 516c of PMOS transistor 516. TXD pin 512 of microcontroller 507 is connected with collector 516c of PMOS transistor 516.

Moreover, while the above discussion and figures describe a communication interface circuit between an RS232 port and a National Semiconductor COP8SA microcontroller featuring a pin-addressable parallel 8-bit port, the present invention is not limited to this specific configuration. A communication interface circuit between an RS232 port and another type of microcontroller would also fall within the scope of the present invention. In such an alternative embodiment, the simple software program controlling inversion of received voltage signals and performing serial-to-parallel and parallel-to-serial conversions would differ from the program specific to the COP8SA part and set forth in the SOURCE CODE APPENDIX. Moreover, while the port of the COP8SA is pin addressable, the present invention could also be employed with a port addressable microcontroller in conjunction with the use of a mask function.

In a further alternative embodiment of the present invention wherein communication occurs between serial ports of devices of dissimilar logic families, the serial/parallel conversion conventionally performed by the UART and replaced by the microcontroller in the first embodiment, is unnecessary. However, level translation would still be performed by operation of the intervening switching transistor.

Furthermore, while the above discussion describes a communication circuit interposed between an RS232 device and a TTL device, the present invention is not limited to this particular configuration.

In yet another alternative embodiment of the present invention, the principles employed above in FIGS. 2 and 3A–3F could also be utilized to permit communication between an RS232 port and a microcontroller utilizing one of the reduced voltage TTL standards employed for portable devices. And where the power supply of the TTL microcontroller is below the +3V receiver threshold value established by the RS232 standard, it is possible to utilize a variant of the RS232 standard to accomplish communication.

For example, one RS232 variant (known as International Telegraph and Telephone Consultative Committee (CCITT) recommendation v.10) utilizes a receiver threshold value of +0.3V rather than +3V. Another variant (known as CCITT recommendation v.11) utilizes a threshold activation voltage of +0.2V rather than +3V. Communication between either of these RS232 variants and a non-RS232 device having a low power supply rail would be possible as long as the power supply of the non-RS232 device is high enough to activate the switching transistor.

Finally, while the above discussion and figures describe an embodiment of an interface circuit between an RS232 device and a dissimilar peripheral, the present invention is not limited to an RS232 device. Any device which 1) exhibits a receiver threshold value exceeded by the power supply of a second device, and which 2) transmits a default voltage during an idle state which can be conveyed back to the receive data pin of the original device, is eligible for implementation of the apparatus and method in accordance with the present invention.

Given the above description and the variety of embodiments described therein, it is intended that the following claims define the scope of the present invention, and that the devices and processes within the scope of these claims and their equivalents be covered hereby.

SOURCE CODE APPENDIX

```
;====================================================================
;                      Software UART for SPI-to-RS232
;                      for National Semiconductor's COP8SAx
;                          Rev 0.1, February 20, 1998
;       > Configured for COP8SAC @ 10MHz
;       > Hardware target = COP8-EVAL-HI01 (COP8 Evaluation Board)
;       > Uses "HyperTerminal" under Windows 95
;                          by: Steven Goldman
;                              National Semiconductor
;                              Senior Field Applications Engineer
;
;
;
;
        .TITLE  SPI-232
        .CHIP   8SAC
        .SECT   MAIN,ROM,ABS=0
;
;
;
;
;
;DECLARATIONS:
        PORTFD   =   0x94       ; PORTF Data Reg
        PORTFC   =   0x95       ; PORTF Config Reg
        PORTFP   =   0x96       ; PORTF Register (Input Only)
        DIPS     =   0x96       ; Dip Switches
        LEDS     =   0xDC       ; LED's
                                ;
        TAURLOB  =   0E6        ; Timer B Reload, Low
        TAURHIB  =   0E7        ; Timer B Reload, High
        TIMERLO  =   0EA
        TIMERHI  =   0EB        ;
        TAURLO   =   0EC        ; Timer A Reload, Low
        TAURHI   =   0ED        ; Timer A Reload, High
        CNTRL    =   0EE
        PSW      =   0EF
        PORTLD   =   0D0
        PORTLC   =   0D1
        PORTLP   =   0D2
        PORTGD   =   0D4
        PORTGC   =   0D5
        PORTGP   =   0D6
        R0       =   0F0
        R1       =   0F1
        TRUN     =   4
        TPND     =   5
        RECREG   =   020        ;REG TO HOLD RECEIVED DATA.
        STKPTR   =   0xFD       ; Stack Pointer
;====================================================================
; RECEIVE PORTION
;
;   1/9600 BAUD = 104 uSEC/BIT DECIMAL = 0068 HEX
;   1/2 BIT TIME IS = 52 uSEC = 52 DECIMAL = 0034 HEX.
;
;
;
START:          LD PORTFC, #0x00        ; Setup PortF as INPUT
                LD A, DIPS
                IFEQ A, #0x00           ; Dislay Revision Number
                JMP REVNUM              ;
                                        ;
                IFEQ A, #0x01           ; Receive Routine
```

SOURCE CODE APPENDIX-continued

```
                JMP RECROUT         ;
                                    ;
                IFEQ A, #0x02       ; Transmit Routine
                JMP CALLXMIT        ;
                                    ;
                IFEQ A, #0x03       ; Toggles RXD line
                JMP DEBUG1          ;
                                    ;
                IFEQ A, #0x04       ; Transmit "N"
                JMP SEND_N          ;
                                    ;
                LD A, #0xFF         ; Error Trap
                JSR ATOLEDS
                JMP HERE
                                    ;
                                    ;
                                    ;
;
;----------------------------------------------------------------
;
REVNUM:         LD A, #0x17         ;
                JSR ATOLEDS         ;
                JMP HERE            ;
;
;----------------------------------------------------------------
;
DEBUG1:         JSR ATOLEDS         ; Displays the Routine Number (3)
                RBIT 0, PORTLC      ; Make sure it is input pin
                SBIT 1, PORTLC      ; Configure RXD pin as OUTPUT
                LD B, #PORTLD
TOGGLE:         SBIT 1, [B]
                RBIT 1, [B]
                JP TOGGLE
;
;----------------------------------------------------------------
;
RECROUT:        JSR ATOLEDS
                RBIT 0, PSW         ; Disable all interrupts.
                LD SP, #02F
                 RC
                LD PORTGC ,#0x08    ; SET UP G1,& G2 AS INPUTS.
                LD PORTLC, #0x0E    ; Set up L0 as input, L1/L3 as output.
                   SBIT 1, PORTLD
                   RBIT 3, PORTLD
                                    ;
STRTRX:         CLRA                ;
                RBIT 3, PORTLD
                   RBIT TRUN, CNTRL ; Make sure timer1 is off.
                LD TIMERLO, #0x0E   ; Load Half timer LB
                LD TIMERHI, #0x0O     ; Load Half timer HB
SETIMR:         LD TAURLO, #0x62    ; Load Baudrate LB
                LD TAURHI, #0x00      ; Load Baudrate HB
                LD TAURLOB, #0x00   ;
                LD TAURHIB, #0x00   ;
                   LD CNTRL, #0xA0
                   LD R1, #0x08     ; (n-1) Data bits=8
                                    ;
IDLE:           IFBIT 0, PORTLP
                   JP TRIGGER
                   JP IDLE
                                    ;
                                    ;
                   RBIT 2, PORTLD
TRIGGER:        SBIT 3, PORTLD
                                    ;
CHECK:          SBIT TRUN , CNTRL   ; Start Timer
                RBIT TPND , PSW     ; Reset Interrupt pending flag
CHECK0:         IFBIT TPND , PSW    ; Test mt flag
                JP CONTST
                JP CHECK0
CONTST:         RBIT TRUN, CNTRL    ; Stop the timer
                   SBIT TRUN, CNTRL    ; Start the timer
                RBIT TPND , PSW     ; Reset Interrupt Pending flag
                   IFBIT 0, PORTLP    ; Test for valid Start Bit
                   JP VALSTART
                   JP STRTRX
                                    ;
                                    ;
                                    ;
```

SOURCE CODE APPENDIX-continued

```
VALSTART:    SBIT 2, PORTLD
             RBIT 2, PORTLD
                                      ;
                                      ;
                                      ;
RECEV:                                ;
                                      ;
CHECK1:      IFBIT TPND, PSW          ; Receive bit in the middle
             JP CONT
             JP CHECK1
CONT:        RBIT TRUN, CNTRL         ; Stop the timer
             SBIT TRUN, CNTRL         ; Start the timer
             RBIT TPND, PSW           ;
             SBIT 2, PORTLD           ; Sampling pulse, per bit
             RBIT 2, PORTLD           ;
                                      ;
             LD A, RECREG             ; Load receive buffer
             SC                       ; Assume this was at Ground, then "1"
             IFBIT 0, PORTLP          ; If at +5VDC, then "0"
             RC                       ; Reset Carry is skipped if "1"
             RRCA                     ; Either way, rotate Right
             X A, RECREG              ; Store as latest value
             DRSZ R1                  ; Are we done yet?
             JP RECEV                 ; No . . . get more
FINISH:      SBIT 3, PORTLD           ; Golly! We are almost done
             LD A, RECREG             ; Display byte
             JSR ATOLEDS
             RBIT 3, PORTLD           ; Trigger scope (end of frame)
             JP STRTRX                ; Go get more
;
;
;
;================================================================
ATOLEDS:                              ; Value must be in Accumulator
                                      ; Since 1=LED Off, "A" must
                                      ; become NOT A (or /A). Inverted
                                      ; value is then displayed. Flow
                                      ; returns to caller.
                                      ;
                                      ;
             IFEQ A, #0X0D            ; If carriage return (0x0D), return.
             RET
             XOR A, #0xFF             ; Invert each bit
             LD B, #LEDS              ;
             X A, [B]                 ; Transfer /A to LED's
             LD A, LEDS
             XOR A, #0xFF
             RET                      ;
;
;================================================================
;
HERE:        JMP HERE                 ; Subroutine used to wait
                                          ; for Reset
                                      ;
                                      ;
                                      ;
;================================================================
;
;
;    TRANSMISSION PORTION
;    ----------------------------------
;    Generic Calling Routine
;
XMIT:                                 ; Soft UART Transmit routine
                                      ;   Uses L.1 as an output
                                      ;   Assumes L.0 is input
                                      ;   Supports Half-duplex mode
                                      ;
             SBIT 3, PORTLC           ; Set TRIGGER (L.3) as output
             SBIT 1, PORTLC           ; RXD (send to PC)
             RBIT 0, PORTLC           ; TXD (from PC)
             LD TIMERLO, #0x62        ; Setup Timers
             LD TIMERHI, #0x00        ;
             LD TAURLO, #0x62         ;
             LD TAURHI, #0x00         ;
             LD TAURLOB, #0x00        ;
             LD TAURHIB, #0x00        ;
             LD CNTRL, #0xA0          ;
                                      ;
```

SOURCE CODE APPENDIX-continued

```
                LD R1, #0x08           ; Set for 8 data bits
                                       ;
                RBIT 3, PORTLD         ; Set TRIGGER (L.3) LOW for frame sync
                SBIT 3, PORTLD         ; Set TRIGGER (L.3) HIGH for frame sync
                RBIT 1, PORTLD         ; Transmit Start Bit (0)
                JSR WFOBT              ; Wait For One Bit Time
                                       ;
MOREBITS:       RRCA                   ; More next bit to "CARRY"
                                       ;
                RBIT 1, PORTLD         ; Assume we XMIT "0"
                IFC                    ; Are we wrong?
                SBIT 1, PORTLD         ; Sorry, XMIT "1"
                JSR WFOBT              ; Either way, wait
                DRSZ R1
                JMP MOREBITS
                                       ;
SENDSTOP:       SBIT 1, PORTLD         ;
                JSR WFOBT              ;
                RET                    ; Return to calling routine
;
;----------------------------------------------------------------------
;
WFOBT:          SBIT TRUN, CNTRL       ; Wait For One Bit Time
                IFBIT TPND, PSW
                JP BT_DONE             ; Get ready for next one
                JP WFOBT
BT_DONE:        RBIT TPND, PSW         ; Reset Timer
                RET                    ; Return to Calling Routine
;
;----------------------------------------------------------------------
;
CALLXMIT:       LD LEDS, #0xF8         ;
                LD A, #'C'             ; Transmit "COP8-"
                JSR XMIT               ;
                LD A, #'O'             ;
                JSR XMIT               ;
                LD A, #'P'             ;
                JSR XMIT               ;
                LDA, #'8'              ;
                JSR XMIT               ;
                LD A, #'—'             ;
                JSR XMIT               ;
                JMP CALLXMIT           ; Do it again, & again, & again . . .
                                       ;
                                       ;
;
;----------------------------------------------------------------------
;
SEND_N:         LD LEDS, #0xFB         ;
AA:             LD A, #'N'             ;
                JSR XMIT               ;
                JMP AA                 ;
;
;----------------------------------------------------------------------
;
;
                .END START
```

What is claimed is:

1. A method of communicating between a first device utilizing a first logic family and a second device utilizing a second logic family different from the first logic family, the method comprising the steps of:
forming an electrical connection between a first node of a switch and a transmit data terminal of the first device;
forming an electrical connection between the first node and a transmit data terminal of the second device;
forming an electrical connection between the first node and a receive data terminal of the second device;
forming an electrical connection between a second node of the switch and a power supply of the first device;
forming an electrical connection between a control node of the switch and a receive data terminal of the first device;
transmitting a first power supply voltage from the receive data terminal of the first device to the control node, such that the switch is placed into a first state and a second power supply voltage is conveyed from the transmit data terminal of the second device to the transmit data terminal of the first device;
transmitting the first power supply voltage from the receive data terminal of the first device to the control node, such that the switch is placed into the first state and a third power supply voltage is conveyed from the transmit data terminal of the second device to the receive data terminal of the second device; and
transmitting a fourth power supply voltage from the receive data terminal of the first device to the control node, such that the switch is placed into a second state and the first power supply voltage is conveyed from the first device to the receive data terminal of the second device, the second device interpreting the received first power supply voltage traversing a receiver threshold value as a first logic state.

2. The method according to claim 1 wherein:

the step of forming an electrical connection between the first node and a transmit data terminal of the second device comprises forming an electrical connection between the first node and a transmit data terminal of an RS232 device;

the step of forming an electrical connection between the first node and a receive data terminal comprises forming an electrical connection between the first node and a receive data terminal of the RS232 device;

the step of transmitting a first power supply voltage from the receive data terminal of the first device to the control node causes an RS232 power supply voltage of approximately −12V to be conveyed from the RS232 transmit data terminal to the RS232 receive data terminal; and the step of transmitting a fourth power supply voltage from the receive data terminal of the first device to the control node causes the first power supply voltage traversing a +3V receiver threshold value to be conveyed to the RS232 receive data terminal.

3. The method according to claim 2 wherein:

the step of forming an electrical connection between the first node and a transmit data terminal of the first device comprises forming an electrical connection between the first node and a transmit data terminal of a TTL microcontroller;

the step of forming an electrical connection between the second node and the power supply comprises forming an electrical connection between the second node and a power supply bearing a +5V TTL microcontroller power supply voltage;

the step of forming an electrical connection between the control node and a receive data terminal of the first device comprises forming an electrical connection between the control node and the receive data terminal of the TTL microcontroller;

the step of transmitting a first power supply voltage from the receive data terminal of the first device to the switch control node comprises transmitting a +5V TTL microcontroller power supply voltage to the control node to cause the +5V TTL microcontroller power supply voltage to be conveyed from the RS232 transmit data terminal to the receive data terminal of the TTL microcontroller; and the step of transmitting a fourth power supply voltage from the receive data terminal of the first device to the control node comprises transmitting a 0V TTL microcontroller power supply voltage to the control node to cause the +5V TTL microcontroller power supply voltage traversing the receiver threshold value to be conveyed to the receive data terminal of the RS232 device.

4. The method according to claim 1 wherein:

the step of forming an electrical connection between the first node and a transmit data terminal of the first device comprises forming an electrical connection between a collector of a PNP transistor and the transmit data terminal of the first device;

the step of forming an electrical connection between the first node and a transmit data terminal of the second device comprises forming an electrical connection between the PNP collector and the transmit data terminal of the second device;

the step of forming an electrical connection between the first node and a receive data terminal of the second device comprises forming an electrical connection between the PNP collector and the receive data terminal of the second device;

the step of forming an electrical connection between the second switch node and a power supply of the first device comprises forming an electrical connection between an emitter of the PNP transistor and the power supply of the first device; and the step of forming an electrical connection between a control node of the switch and a receive data terminal of the first device comprises forming an electrical connection between a base of the PNP transistor and the receive data terminal of the first device.

5. The method according to claim 1 wherein:

the step of forming an electrical connection between the first node and a transmit data terminal of the first device comprises forming an electrical connection between a drain of a PMOS transistor and the transmit data terminal of the first device;

the step of forming an electrical connection between the first node and a transmit data terminal of the second device comprises forming an electrical connection between the PMOS drain and the transmit data terminal of the second device;

the step of forming an electrical connection between the first node and a receive data terminal of the second device comprises forming an electrical connection between the PMOS drain and the receive data terminal of the second device;

the step of forming an electrical connection between the second node and a power supply of the first device comprises forming an electrical connection between a source of the PMOS transistor and the power supply of the first device; and the step of forming an electrical connection between a control node of the switch and a receive data terminal of the first device comprises forming an electrical connection between a gate of the PMOS transistor and the receive data terminal of the first device.

* * * * *